(12) United States Patent
Lee

(10) Patent No.: US 8,828,772 B2
(45) Date of Patent: Sep. 9, 2014

(54) HIGH ASPECT RATIO MEMS DEVICES AND METHODS FOR FORMING THE SAME

(75) Inventor: Te-Hao Lee, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 79 days.

(21) Appl. No.: 13/412,257

(22) Filed: Mar. 5, 2012

(65) Prior Publication Data

US 2013/0230939 A1 Sep. 5, 2013

(51) Int. Cl.
  *H01L 21/316* (2006.01)
(52) U.S. Cl.
  USPC .............................. 438/52; 438/705
(58) Field of Classification Search
  None
  See application file for complete search history.

(56) References Cited

U.S. PATENT DOCUMENTS

| 2006/0057758 A1* | 3/2006 | Yokoyama ...................... 438/51 |
| 2009/0206423 A1* | 8/2009 | Kiihamaki et al. ............ 257/419 |
| 2010/0188728 A1* | 7/2010 | Warashina et al. ........... 359/290 |

* cited by examiner

*Primary Examiner* — Zandra Smith
*Assistant Examiner* — Pamela E Perkins
(74) *Attorney, Agent, or Firm* — Duane Morris LLP

(57) ABSTRACT

An HF vapor etch etches high aspect ratio openings to form MEMS devices and other tightly-packed semiconductor devices with 0.2 um air gaps between structures. The HF vapor etch etches oxide plugs and gaps with void portions and oxide liner portions and further etches oxide layers that are buried beneath silicon and other structures and is ideally suited to release cantilevers and other MEMS devices. The HF vapor etches at room temperature and atmospheric pressure in one embodiment. A process sequence is provided that forms MEMS devices including cantilevers and lateral, in-plane electrodes that are stationary and vibration resistant.

20 Claims, 6 Drawing Sheets

HIGH ASPECT RATIO MEMS DEVICES AND METHODS FOR FORMING THE SAME

FIELD OF THE DISCLOSURE

The disclosure relates, most generally, to semiconductor manufacturing methods and structures and, more particularly, to forming MEMS (Micro Electro Mechanical System) devices with stationary lateral electrodes using an HF vapor etching process.

BACKGROUND

MEMS (Micro Electro Mechanical System) technologies have become quite prevalent in the semiconductor manufacturing industry. MEMS devices, very small mechanical devices driven by electricity, find utility in many applications. MEMS devices often utilize cantilever-type structures that are free to bend and whose movement is detected by electrodes.

There is a drive to form the cantilevers and other MEMS structures to smaller dimensions as is the case for all semiconductor structures. It is desirable to form the cantilevers or other MEMS devices in close proximity to one another and in close proximity to their respective electrodes. In order to achieve this, it is desirable to form openings with high aspect ratios that are not achievable due to the limitations of commercial etchers. In order to form MEMS devices, it is also necessary to "release" the structures such as by etching an underlying oxide layer beneath the cantilever. There are various challenges associated with having an oxide etchant species access and etch the underlying oxide. Current technologies must utilize release holes that extend through the cantilevers or other moveable mechanical structures to provide access to the underlying oxide. These holes adversely impact the mechanical properties of the MEMS device.

It would be desirable to form MEMS and other devices using processes that can etch high aspect ratio openings and underlying oxide materials.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The disclosure provides for an HF (hydrofluoric acid) vapor etch of oxide materials in the formation of various semiconductor devices such as MEMS devices. The HF vapor etch etches oxide materials that line or fill openings having high aspect ratios. Openings with aspect ratios on the order of about 250:1 can be produced by etching oxide from such openings using the HF vapor etch. The HF vapor etch is used, in one embodiment, to form suspended cantilever structures or other moveable structures used as MEMS devices. The HF vapor etch is also used to form other MEMS devices including various beam-type structures such as clamped beam structures or other suspended mechanical features. In addition to etching oxide materials that are disposed in vertical openings formed at the end or sides of a cantilever structure, the HF vapor etch also extends beneath the cantilever structure and etches oxide materials disposed beneath the cantilever structure to release the cantilever structure.

The HF vapor etching is used in various applications to create openings with high aspect ratios by etching oxides. In some embodiments, the HF vapor etching is used to create MEMS devices which utilize upper and lower electrodes in one embodiment and one or more fixed lateral electrodes in another embodiment. In other embodiments, the HF vapor etching is used in other applications. The HF vapor etching finds utility in any application in which openings with high aspect ratios must be etched. The HF vapor etching operation etches subjacent oxide materials that are buried beneath other structures and not accessible from above, i.e., not directly exposed to the etching species.

The disclosure also provides for forming fixed lateral electrodes such as are used in applications in which moveable mechanical structures bend within a plane, i.e. laterally. The fixed lateral electrodes lie in the same plane as the bendable mechanical structures that bend side to side. The fixed lateral electrodes therefore do not vibrate when the moveable mechanical structure bends, since they are stationary.

The following sequence of processing operations illustrates embodiments in which the HF vapor etching operation is used but it should be understood that these represent one of many embodiments in which the HF vapor etching operation is used.

Figure 1A:
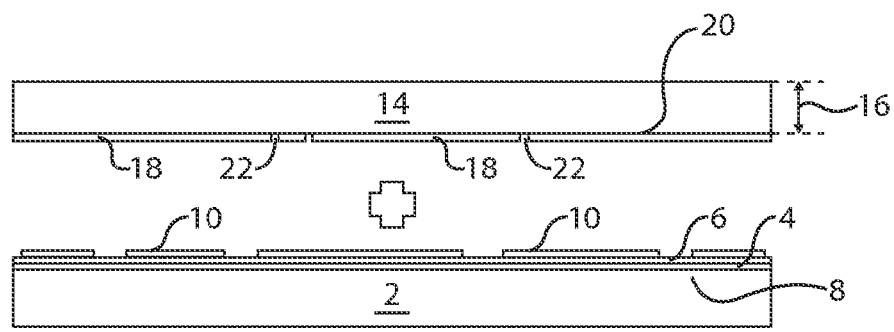
FIGS. 1A-1I are cross-sectional views illustrating a sequence of processing operations used to form MEMS structures according to the disclosure.

FIG. 1A is a cross-sectional view showing substrate 2 with oxide layer 4 formed on substrate surface 8, and etch stop layer 6 formed over oxide layer 4. Substrate 2 is formed of silicon on one embodiment. In other embodiments, substrate 2 is formed of GaAs, glass, or other suitable semiconductor manufacturing substrate materials. Etch stop layer 6 is a SiN film in one embodiment and in other embodiments, etch stop layer 6 is AlN, SiC, low stress SiN, or other materials that are resistant to HF etching and therefore can serve as suitable etch stop layers. Patterned polysilicon 10 is formed over etch stop layer 6 and is used for signal routing in some embodiments. Patterned polysilicon 10 is used as lower electrodes for MEMS devices in various embodiments.

FIG. 1A also shows Si wafer 14 having thickness 16. Release oxide layer 18 is formed on surface 20 and includes oxide release trenches 22. Release oxide layer 18 includes a thickness ranging from about 200 Å to about 10 um in various embodiments. Oxide release trenches 22 extend to surface 20 and are advantageously positioned to accelerate the removal of subjacent oxide materials including release oxide layer 18, during the subsequent HF vapor etching operation. Oxide release trenches 22 have various dimensions in various embodiments and the number of oxide release trenches 22 and the proximity of oxide release trenches 22 to one another varies in various embodiments. SI wafer 14 is formed of crystalline silicon or other silicon materials in various embodiments.

In other embodiments, release oxide layer 18 is not formed on silicon wafer 14 but instead, is formed over the structure formed on substrate 2. According to this embodiment, the release oxide layer is formed over patterned polysilicon 10 and etch stop layer 6 using various formation methods. A CMP (chemical mechanical polishing) or other polishing operation is used to planarize the structure and tailor the release oxide layer to a desired thickness, in some embodiments.

Figure 1B:
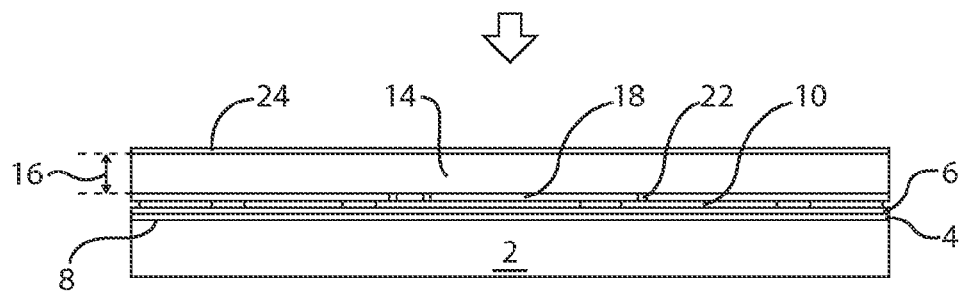

FIG. 1B shows a structure formed when silicon wafer 14 is fusion bonded to substrate 2. Various suitable pressures are used to fusion bond the individual substrates together. After the bonding operation, a polishing operation is used in some embodiments to diminish thickness 16 to a desired thickness. Thickness 16 ranges from about 5 µm-100 µm after polishing in various embodiments but other thicknesses are used in other embodiments. MEMS devices will be formed from silicon wafer 14 in many embodiments and therefore thickness 16 is chosen to produce the desired dimensions for the MEMS structures such as cantilever structures. After polishing, oxide mask 24 is formed over opposed surface 26. Oxide mask 24 is formed to various suitable thicknesses which may be determined by device application or based on other processing considerations.

Figure 1C:
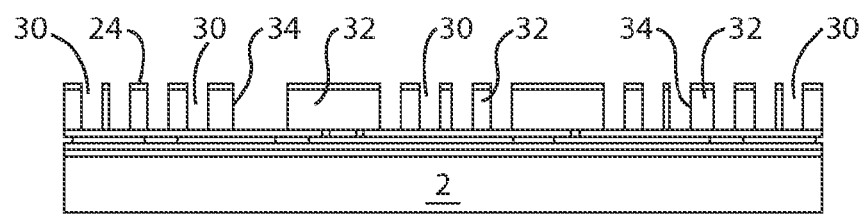

One or more etching operations are then used to sequentially etch unmasked portions of oxide mask 24 and silicon wafer 14, to form the structure shown in FIG. 1C. In FIG. 1C, silicon islands 32 are formed. Silicon islands 32 have various widths and are spaced from one another by openings 30. Each opening 30 is bounded by silicon sidewalls 34. Various suitable photoresist patterning and etching operations are available and are used in various embodiments to produce the structure shown in FIG. 1C. Silicon islands 32 are spaced apart by various distances and at least some of silicon islands 32 will be used as MEMS devices in various embodiments.

Figure 1D:
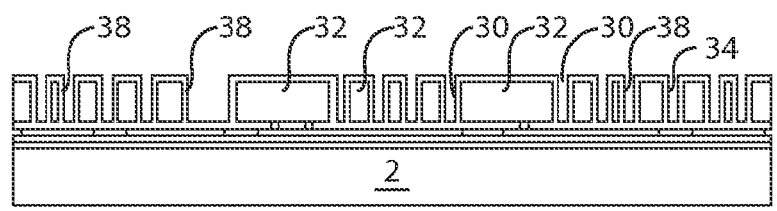

FIG. 1D shows the structure of FIG. 1C after a thin oxide deposition operation has been carried out. Thin oxide 38 is formed on silicon sidewalls 34. In one embodiment, thermal oxidation is used. In another embodiment, LPTEOS (low pressure TEOS) deposition is used. TEOS, tetraethyl orthosilicate, is a gaseous compound commonly used in CVD, chemical vapor deposition, of oxides. LPTEOS is therefore a low pressure CVD oxide deposition operation using tetraethyl orthosilicate. Other methods for forming thin oxide 38 are used in other embodiments. Thin oxide 38 has a thickness ranging from 0.02 µm to 2 µm in one embodiment but various other thicknesses are used in other embodiments. Thin oxide 38 formed on silicon sidewalls 34 occupies portions of openings 30 and produce smaller gaps, i.e. smaller void areas between adjacent silicon islands 32.

Figure 1E:
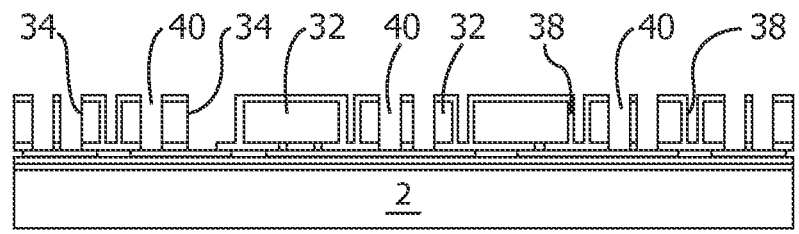

FIG. 1E shows the structure of FIG. 1D after a patterning operation and oxide etching operation are carried out to remove thin oxide 38 from some silicon sidewalls 34. According to some embodiments in which the gaps between silicon islands 32 in FIG. 1D have greater than about a 20:1 aspect ratio, spray coating of photoresist is used. After the photoresist is introduced by spray coating, it is then patterned. An etching operation such as BOE is then used to produce the structure shown in FIG. 1E which includes silicon islands 32 and trenches 40. Some silicon sidewalls 34 of silicon islands 32 are exposed and other silicon sidewalls 34 include unremoved thin oxide 38 thereon. In other words, some trenches 40 include thin oxide 38 on one or both of their lateral sidewalls, and others do not.

Figure 1F:
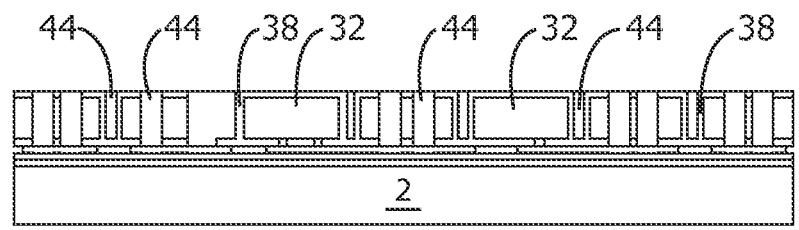

FIG. 1F shows the structure of FIG. 1E after plugs 44 have been formed. Plugs 44 fill trenches 40 of FIG. 1E. LPCVD, low pressure chemical vapor deposition, or other suitable deposition techniques are used to form plugs 44, in various embodiments. The deposition is followed by CMP or other suitable polishing operations to form the structure shown in FIG. 1F. In some embodiments, plugs 44 are formed of polysilicon and in other embodiments, plugs 44 are formed of silicon germanium or other suitable conductive or semiconductive materials. It will be seen that some plugs 44 will be utilized as fixed electrodes in conjunction with the MEMS devices. Some plugs 44 are formed directly adjacent silicon islands 32, and other plugs 44 are separated from silicon islands 32 by thin oxide 38 which has a thickness ranging from 0.02 µm to 2 µm in some embodiments. When thin oxide 38 is removed, as will be described below, air gaps on the order of 0.02 µm to 2 µm may be formed and openings with aspect ratios of as great as 250:1 may be produced.

Figure 1G:
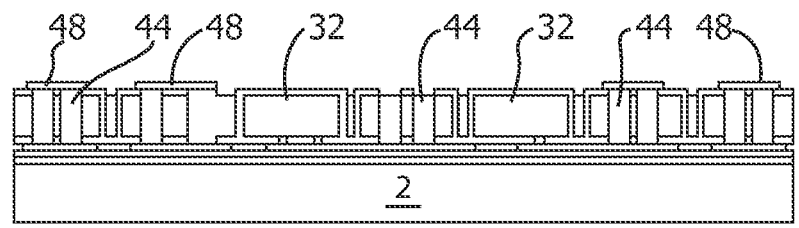

FIG. 1G shows patterned bonding material 48 formed over the structure shown in FIG. 1F. Patterned bonding material 48 is advantageous in eutectic bonding. Patterned bonding material 48 is formed of germanium, Ge, in one embodiment. Patterned bonding material 48 is formed of other suitable materials such as aluminum, aluminum copper, gold and other suitable conductive materials suitable for eutectic bonding, in other embodiments.

Figure 1H:
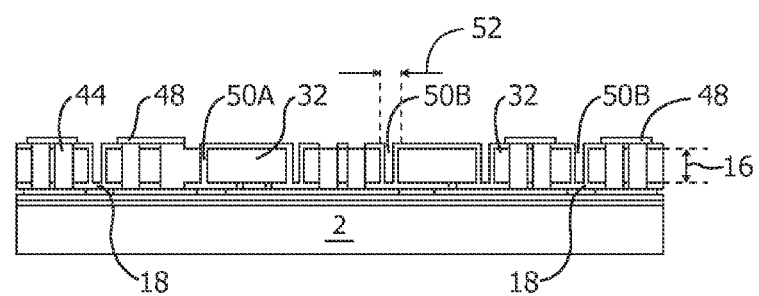

FIG. 1H shows the structure of FIG. 1G after patterning and etching operations have been sequentially carried out. A patterning operation is carried out to expose portions to be etched. This is followed by an etching operation that removes the exposed (unmasked) silicon sections of the structure of FIG. 1G. Various suitable silicon etching techniques including RIE (reactive ion etching) and DRIE (deep reactive ion etching) are used in various embodiments to remove some plugs 44.

FIG. 1H shows the structure formed after the silicon etching operation has been carried out. FIG. 1H shows remaining plugs 44 and silicon islands 32. At some locations, silicon islands 32 are in direct lateral contact with plugs 44. At other locations, silicon islands 32 are spaced from plugs 44. Some silicon islands 32 are also spaced from one another by gaps. According to the embodiment in which plugs 44 are polysilicon, the silicon structures including silicon islands 32 and silicon islands 32 in combination with plugs 44, are separated by gaps 50A, 50B. Some gaps such as gaps 50A are filled with oxide material, i.e. "oxide plugs". Other gaps such as gaps 50B have void areas bounded by oxide materials. The gaps 50A, 50B represent the space between adjacent silicon structures and may be solid oxide or may include oxide liners with a void therebetween. Gaps 50A and 50B have various dimensions. Gap width 52 and thickness 16 of silicon islands 32 determine the aspect ratio of a particular gap. The HF vapor etching process of the disclosure has been demonstrated to be effective in etching aspect ratios as great as 250:1. The HF vapor etching process of the disclosure also extends beneath silicon islands 32 and etches subjacent oxide release layer 18 to release MEMS structures. Oxide release trenches 22 expedite the subjacent etching. No holes extend through silicon islands 32.

The structure shown in FIG. 1H is exposed to a vapor HF environment. In one embodiment, the temperature for the HF vapor etch is room temperature. More particularly, in some exemplary embodiments, the HF vapor is not heated and the etching operation may take place at a temperature within the range of about 60° F. to about 80° F. In another embodiment, the temperature is raised 10-15 degrees with respect to room temperature. Various heating methods are used. In other embodiments, other temperatures are used. Ambient atmospheric pressure is used in some embodiments and an decreased pressure is used in other embodiments. Various concentrations of vaporized HF are used in various embodiments. In some embodiments, the HF vapor is diluted with methanol or other suitable materials.

Figure 1I:
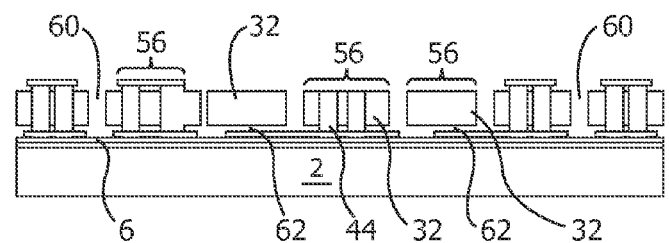

The HF vapor etching operation is carried out and removes exposed oxide materials to produce the structure shown in FIG. 1I. It can be seen that oxide has been removed from gaps 50A and 50B of FIG. 1H to produce void gaps 60. Portions 56 represent silicon islands 32 (see previous FIGS.) and silicon islands 32 in conjunction with plugs 44. According to the embodiment in which plugs 44 are silicon, portions 56 are silicon. According to this and other embodiments, portions 56 are spaced from one another by void gaps 60. Oxide such as release oxide layer 18 is also removed from subjacent areas 62 releasing silicon islands 32 to serve as MEMS cantilever structures. The HF vapor effectively etches the oxide materials from the gaps to produce void gaps 60 which may have an aspect ratio of as great as 250:1. Thickness 16 may range from about 25 μm-75 μm and the width of some void gaps 60 may be as narrow as 0.2 μm in some embodiments. In other embodiments, other dimensions are used. The HF vapor etch also reaches the otherwise buried oxide layers such as release oxide layer 18. (See FIG. 1H) Etch stop layer 6 as described above, stops the etch from penetrating further.

FIGS. 2A-2F represent another embodiment representing another sequence of processing operations used instead of the operations shown and described in FIGS. 1C-1F.

Figure 2A:
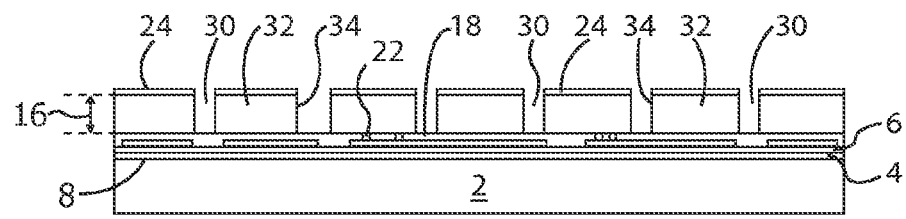
FIGS. 2A-2F are cross-sectional views illustrating a sequence of processing operations as an alternative to the processing operations shown in FIGS. 1C-1F according to another embodiment of the disclosure.

FIG. 2A illustrates a structure such as may be formed by carrying out an etching operation on the structure shown in FIG. 1B. FIG. 2A is comparable to FIG. 1C except the structure shown in FIG. 2A includes each of the silicon islands 32 having about the same width as one another. Silicon islands 32 are spaced from one another by openings 30. Each opening 30 is bounded by silicon sidewalls 34. Various suitable photoresist patterning and etching operations are available and are used in various embodiments to produce the structure shown in FIG. 2A from the structure shown in FIG. 1B. The structure in FIG. 2A includes substrate 2, oxide layer 4, etch stop layer 6, release oxide layer 18, and oxide mask 24. Silicon islands 32 include thickness 16.

Figure 2B:
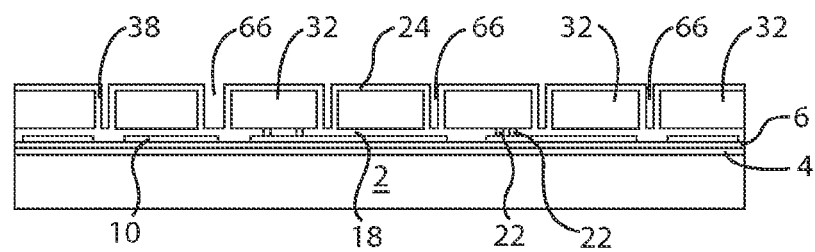

FIG. 2B shows the structure of FIG. 2A after a thin oxide deposition operation has been carried out. Thin oxide 38 is formed on silicon sidewalls 34. Thin oxide 38 is formed by thermal oxidation in one embodiment. Thin oxide 38 is formed using LPTEOS deposition methods in another embodiment. Other methods for forming thin oxide 38 are used in other embodiments. Thin oxide 38 has a thickness ranging from about 0.02 μm to 2 μm in one embodiment but various other thicknesses are used in other embodiments. Thin oxide 38 formed on silicon sidewalls 34 occupies portions of previous openings 30 to produce smaller void areas lined with thin oxide 38, in the gaps between silicon islands 32. Voids 66 are present in the gaps between silicon islands 32.

Figure 2C:
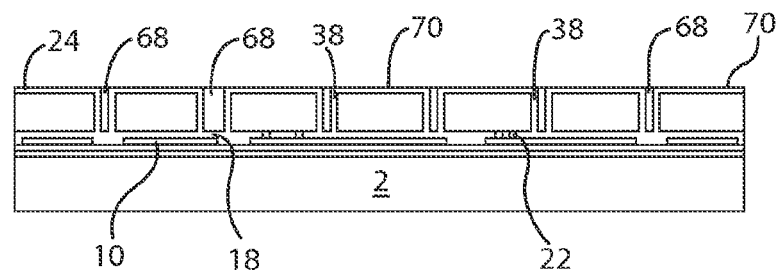

FIG. 2C shows the structure of FIG. 2B after plugs 68 are formed within voids 66 that were present in FIG. 2B. In one embodiment, plugs 68 are formed of polysilicon. In another embodiment, plugs 68 are formed of SiGe or other suitable conductive materials. Plugs 68 are formed by a deposition process such as LPCVD, followed by a polishing operation that planarizes the structure, in one embodiment. In other embodiments, different deposition methods are used. Chemical mechanical polishing is the polishing operation in some exemplary embodiments but other polishing methods are used in other exemplary embodiments. The polishing operation produces substantially planar upper surface 70.

Figure 2D:
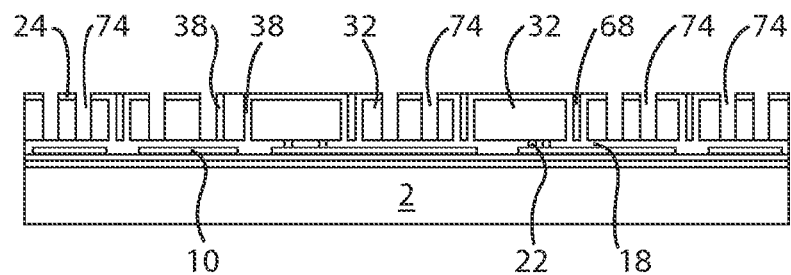

A photoresist operation is carried out on the structure shown in FIG. 2C to produce the structure of FIG. 2D. Conventional or other photoresist coating methods are used in various embodiments. Although spray coating of photoresist is not required due to planar upper surface 70, spray coating can be used in some embodiments. FIG. 2D shows the structure of FIG. 2C after masking operation and oxide etching operation have been carried out to form a photoresist mask, then etch through oxide mask 24. A silicon etching operation is used to etch uncovered portions of silicon islands 32. Various oxide and silicon etching operations are used in various exemplary embodiments. The etching operations produce openings 74.

Figure 2E:
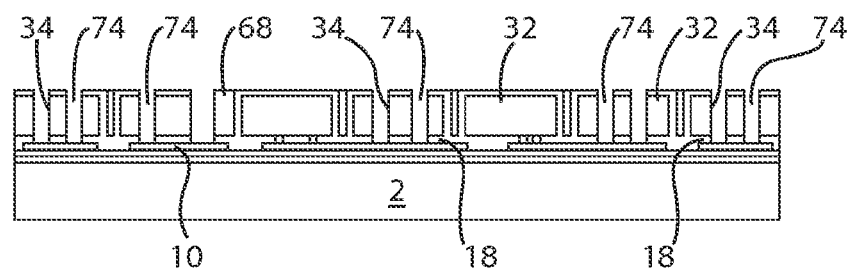

FIG. 2E shows the structure of FIG. 2D after an oxide etching operation has been carried out upon the structure shown in FIG. 2D with the photoresist mask (not shown) still intact over the structure shown in FIG. 2D. The etching operation is BOE, buffered oxide etching, in one embodiment. Wet or dry etching operations are used in various embodiments. The etching operation removes exposed oxide portions such as thin oxide layer 38 from silicon sidewalls 34 and also exposed portions of release oxide layer 18.

Figure 2F:
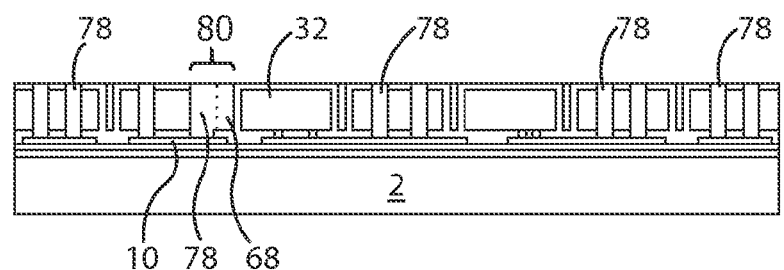

FIG. 2F shows the structure of FIG. 2E after openings 74 are filled with a further plug material. Further plug material 78 fills openings 74 of FIG. 2E. LPCVD, low pressure chemical vapor deposition, or other suitable deposition techniques can be used. The deposition is followed by CMP or other suitable polishing operations to form the structure shown in FIG. 2F. In some embodiments, further plug material 78 is formed of polysilicon and in other embodiments, further plug material 78 is formed of silicon germanium or other suitable conductive or semiconductive materials. Fixed electrode 80 is formed of further plug material 78 and plugs 68. Fixed electrode 80 is coupled to patterned polysilicon 10 which provides electrical connection, in some embodiments. Fixed electrode 80 is a lateral electrode that can sense the movement of a MEMS structure formed from silicon island 32 that is immediately adjacent the right hand side of fixed electrode 80, after an etching operation is used to release silicon islands 32 so that released silicon island 32 that is immediately adjacent the right hand side of fixed electrode 80, may serve as a mechanical feature that bends left-to-right.

FIG. 2F is comparable to the structure shown in FIG. 1F and can undergo subsequent processing operations such as described in conjunction with FIGS. 1G-1I, including the HF vapor etch.

The structure of FIG. 1I shows portions 56 that include some silicon islands 32 and other portions 56 that include silicon islands 32 in conjunction with additional structures as described above. Some portions 56 include silicon island portions 32 from silicon wafer 14 and plug materials 44. According to the embodiment in which plug materials 44 are polysilicon, portions 56 are also silicon structures. According to this embodiment, FIG. 1I shows a number of discrete silicon structures spaced apart by void gaps 60. In some embodiments, silicon islands 32 are used as MEMS structures. It should be understood that each MEMS structure 32 is anchored to substrate 2 although the anchor is not shown in the cross section of FIG. 1I.

Figure 3:
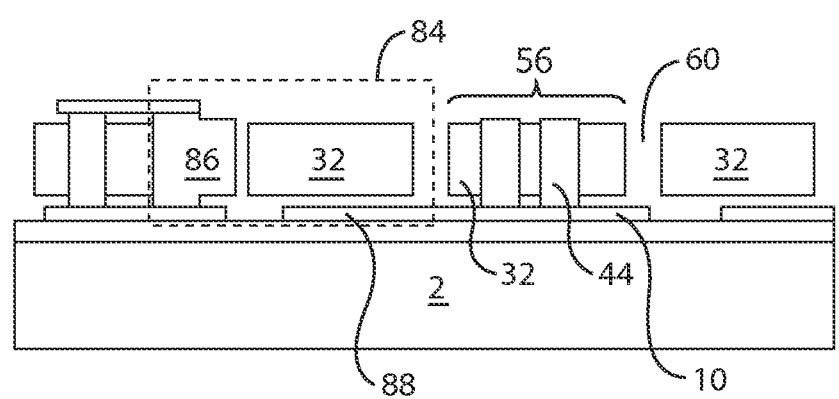
FIG. 3 shows a MEMS structure formed according to an embodiment of the disclosure.

FIG. 3 shows a portion of the structure of FIG. 1I, in greater detail. In one embodiment, silicon island 32 identified within dashed box 84 moves left-to-right in conjunction with fixed electrode 86 formed of plug 44 and which is in the same plane as the MEMS structure, i.e. silicon island 32 in dashed box 84. In another embodiment, silicon island 32 within dashed box 84 is a cantilever MEMS structure that moves up and down and works in conjunction with lower electrode 88 formed of patterned polysilicon 10. According to this embodiment upper electrodes may also be formed over the MEMS structure. In other embodiments, the various structures shown in FIG. 1I and FIG. 3 are used as various MEMS structures including cantilevers that bend left-to-right, or up-and-down, or other mechanical structures such as other suspended beam-type structures, in various embodiments.

After the structure in FIG. 1I is formed, subsequent processing operations are carried out. The subsequent processing operations may include the formation of additional electrodes that may be formed over the MEMS structures, additional wiring features and other associated processes and features. The structure in FIG. 1I can then be packaged using various packaging techniques. In some embodiments, the packaging techniques include additional packaging wafers that may be bonded to the structure in FIG. 1I and utilized along with through-silicon vias ("TSV's"). Other packaging techniques are used in other embodiments.

According to one aspect, a method for forming a semiconductor device is provided. The method comprises: providing a substrate with structures thereover, the structures spaced apart by gaps including gaps filled with oxide and gaps including voids and lined with oxides and at least some of the structures having a release oxide. liner formed thereunder; and, etching in an HF vapor that removes the oxides in the gaps and the release oxide liner.

In another aspect, a method for forming MEMS (micro electro mechanical system) devices is provided. The method comprises: providing a substrate with discrete silicon-based portions disposed thereover, the discrete silicon-based portions spaced apart by oxide plugs and openings lined with oxide liners; etching the oxide plugs and the oxide liners in an HF vapor thereby producing gaps between the discrete silicon-based portions, the gaps defined by opposed sides of the discrete silicon-based portions, wherein at least some of the discrete silicon-based portions are further processed to serve as MEMS devices.

The preceding merely illustrates the principles of the disclosure. It will thus be appreciated that those of ordinary skill will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the. figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for forming a semiconductor device, said method comprising:
    providing a substrate with structures thereover, said structures spaced apart by gaps including gaps filled with oxide and gaps including voids and lined with oxides and at least some of said structures having a release oxide liner formed thereunder; and
    etching in an HF vapor that removes said oxides in said gaps and said release oxide liner.

2. The method as in claim 1, wherein said structures comprise silicon including crystalline silicon portions and polysilicon portions.

3. The method as in claim 1, wherein said etching includes etching at atmospheric pressure and at a temperature within a range of about 60° F. to 80° F.

4. The method as in claim 1, wherein said gaps include gaps with aspect ratios greater than 200:1.

5. The method as in claim 1, wherein said structures comprise Si-based structures that comprise at least one MEMS cantilever structure and at least one fixed electrode after said etching.

6. The method as in claim 5, wherein said at least one cantilever structure and said at least one fixed electrode are in the same plane, said at least one fixed electrode disposed laterally adjacent said at least one cantilever structure.

7. The method as in claim 1, wherein said providing a substrate with discrete silicon-based portions includes forming an etch stop layer over said substrate and etching openings in said silicon wafer to produce said discrete silicon-based portions.

8. A method for forming a semiconductor device, said method comprising:
    providing a substrate with structures thereover, said structures spaced apart by gaps including gaps filled with oxide and gaps including voids and lined with oxides and at least some of said structures having a release oxide liner formed thereunder; and
    etching in an HF vapor that removes said oxides in said gaps and said release oxide liner,
    wherein said structures are Si-based structures that include sections of silicon germanium.

9. A method for forming MEMS (micro electro mechanical system) devices, said method comprising:
    providing a substrate with discrete silicon-based portions disposed thereover, said discrete silicon-based portions spaced apart by oxide plugs and openings lined with oxide liners;
    fusion bonding a silicon wafer to said substrate;
    performing an HF vapor etching operation that etches said oxide plugs and said oxide liners in an HF vapor thereby producing gaps between said discrete silicon-based portions, said gaps defined by opposed sides of said discrete silicon-based portions; and
    further processing to form MEMS devices from at least some of said discrete silicon-based portions.

10. The method as in claim 9, wherein said MEMS devices are cantilever or other suspended beam-type structures formed of crystalline silicon and said discrete silicon-based portions further include stationary lateral electrodes formed of polysilicon disposed adjacent said MEMS devices.

11. The method as in claim 9, further comprising subjacent oxide materials between said substrate and said discrete silicon-based portions and wherein said performing further etches said subjacent oxide materials.

12. The method as in claim 9, wherein at least one of said MEMS devices comprises a cantilever structure anchored to said substrate and spaced above said substrate by a release oxide layer at other portions thereof and wherein said performing releases said cantilever structure by further etching said release oxide layer.

13. The method as in claim 12, wherein air gaps are present in said release oxide layer and no holes extend through said silicon-based portions.

14. The method as in claim 12, further comprising forming an associated electrode below each of said at least some MEMS devices, each said lower electrode formed of polysilicon, and wherein said performing comprises said HF vapor diluted in methanol.

15. The method as in claim 9, further comprising polishing said silicon wafer after said fusion bonding to reduce thickness thereof, and wherein said silicon wafer includes a release oxide layer on a bonding surface thereof and said fusion bonding comprises fusion bonding said bonding surface to said substrate.

16. The method as in claim 9, further comprising polishing said silicon wafer after said fusion bonding to reduce thickness thereof, oxidizing to form said oxide liners along sidewalls of said openings, patterning using spray coating of photoresist, and oxide etching to remove some of said oxide liners.

17. The method as in claim 9, wherein said discrete silicon-based portions include first silicon-based portions formed of crystalline silicon and second silicon-based portions formed of polysilicon sections and crystalline silicon sections.

18. The method as in claim 9, wherein said providing a substrate with discrete silicon-based portions includes:
    forming an etch stop layer over said substrate,
    etching openings in said silicon wafer,
    filling some of said openings with polysilicon plugs and further etching to form said discrete silicon-based portions from said silicon wafer and said polysilicon plugs.

19. The method as in claim 18, wherein said polysilicon plugs comprise vertical electrodes associated with said MEMS devices.

20. The method as in claim 8, wherein said performing comprises said HF vapor at a temperature within a range of about 60° F. to about 80° F. and atmospheric pressure.

* * * * *

UNITED STATES PATENT AND TRADEMARK OFFICE
CERTIFICATE OF CORRECTION

PATENT NO. : 8,828,772 B2  
APPLICATION NO. : 13/412257  
DATED : September 9, 2014  
INVENTOR(S) : Te-Hao Lee Page 1 of 1

It is certified that error appears in the above-identified patent and that said Letters Patent is hereby corrected as shown below:

In the Claims:

Column 8, Line 24, remove "range of about 60° F. to 80° F." and insert -- range of about 60° F to 80° F. -- therefor.

Column 10, Line 22, remove "8" and insert -- 9 -- therefor.

Column 10, Line 24, remove "about 60° F. to about 80° F." and insert -- about 60°F to about 80°F -- therefor.

Signed and Sealed this  
Seventeenth Day of February, 2015

Michelle K. Lee  
*Deputy Director of the United States Patent and Trademark Office*